(12) United States Patent
Ito et al.

(10) Patent No.: US 11,166,396 B2
(45) Date of Patent: Nov. 2, 2021

(54) BOX-TYPE VEHICLE-MOUNTED CONTROL DEVICE

(71) Applicant: Hitachi Automotive Systems, Ltd., Hitachinaka (JP)

(72) Inventors: Maki Ito, Tokyo (JP); Toshiaki Ishii, Tokyo (JP); Masaru Kamoshida, Ibaraki (JP); Hideto Yoshinari, Ibaraki (JP); Masato Saito, Ibaraki (JP); Akitoyo Konno, Tokyo (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 254 days.

(21) Appl. No.: 14/893,774

(22) PCT Filed: May 12, 2014

(86) PCT No.: PCT/JP2014/062548
§ 371 (c)(1),
(2) Date: Nov. 24, 2015

(87) PCT Pub. No.: WO2014/203648
PCT Pub. Date: Dec. 24, 2014

(65) Prior Publication Data
US 2016/0106010 A1    Apr. 14, 2016

(30) Foreign Application Priority Data
Jun. 17, 2013   (JP) .............................. JP2013-126387

(51) Int. Cl.
*H05K 7/20*    (2006.01)
*H05K 1/02*    (2006.01)
(Continued)

(52) U.S. Cl.
CPC ....... *H05K 7/20854* (2013.01); *H05K 1/0206* (2013.01); *H05K 1/0209* (2013.01);
(Continued)

(58) Field of Classification Search
CPC ........... H05K 7/20845; H05K 7/20854; H05K 7/20409; H05K 1/0206; H05K 1/0209;
(Continued)

(56) References Cited

U.S. PATENT DOCUMENTS 5,467,251 A * 11/1995 Katchmar ........... H01L 23/3672
174/252
2001/0004316 A1 * 6/2001 Denzene ............ H01R 13/5219
361/816

(Continued)

FOREIGN PATENT DOCUMENTS

JP   2003-198165 A    7/2003
JP   2004-304200 A    10/2004
(Continued)

OTHER PUBLICATIONS

PCT International Search Report on application PCT/JP2014/062548 dated Aug. 5, 2014; 6 pages.
(Continued)

*Primary Examiner* — Anatoly Vortman
*Assistant Examiner* — Zhengfu J Feng
(74) *Attorney, Agent, or Firm* — Foley & Lardner LLP (57) ABSTRACT

Provided is a box-type vehicle-mounted control device that effectively increases the amount of heat transfer from electronic components and a circuit board to a casing (base and cover) and that accordingly has achieved excellent heat dissipation property.
The box-type vehicle-mounted control device includes a circuit board 12, a base 13, and a cover 14. In addition, a first heat radiating coating layer 31 is formed on at least one surface of the circuit board 12, and a second heat radiating coating layer 32 is formed on an inner surface of one or both of the base 13 and the cover 14 facing the first heat radiating coating layer 31.

16 Claims, 8 Drawing Sheets

(51) Int. Cl.
  *H05K 1/18* (2006.01)
  *H01R 12/72* (2011.01)

(52) U.S. Cl.
  CPC ............ H05K 1/18 (2013.01); H05K 7/20409 (2013.01); *H01R 12/724* (2013.01); *H05K 2201/066* (2013.01); *H05K 2201/10189* (2013.01)

(58) Field of Classification Search
  CPC .............. H05K 1/18; H05K 2201/066; H05K 2201/10189; H01R 12/724
  USPC ........................................................ 361/707
  See application file for complete search history.

(56) References Cited

U.S. PATENT DOCUMENTS

| | | | | |
|---|---|---|---|---|
| 2003/0117776 | A1* | 6/2003 | Katsuro | H05K 7/20854 361/705 |
| 2006/0012034 | A1* | 1/2006 | Kadoya | H05K 7/20872 257/712 |
| 2007/0087116 | A1* | 4/2007 | Goetter | B82Y 30/00 427/96.3 |
| 2009/0147482 | A1* | 6/2009 | Katsuro | H05K 7/20454 361/721 |
| 2010/0189993 | A1* | 7/2010 | Mori | C08J 7/047 428/317.5 |
| 2011/0083883 | A1* | 4/2011 | Yugawa | H05K 3/388 174/256 |
| 2012/0320531 | A1 | 12/2012 | Hashimoto et al. | |
| 2013/0307175 | A1* | 11/2013 | Tang | C04B 35/64 264/42 |
| 2013/0329356 | A1* | 12/2013 | Shanbhogue | H05K 1/144 361/679.47 |
| 2014/0217622 | A1* | 8/2014 | Kawate | C08K 3/36 257/791 |

FOREIGN PATENT DOCUMENTS

| | | | | |
|---|---|---|---|---|
| JP | 2004304200 A | * | 10/2004 | |
| JP | 2004304200 A | * | 10/2004 | ............... H05K 7/20 |
| JP | 2005-038975 A | | 2/2005 | |
| JP | 2011-003563 A | | 1/2011 | |
| JP | 2011-140229 A | | 7/2011 | |
| JP | 2011-192937 A | | 9/2011 | |
| JP | 2012-195525 A | | 10/2012 | |
| JP | 2012-204729 A | | 10/2012 | |
| JP | 2013-004611 A | | 1/2013 | |
| JP | 2013004611 A | * | 1/2013 | ........... H05K 5/0052 |
| JP | 2013-084854 A | | 5/2013 | |

OTHER PUBLICATIONS

Office Action dated Sep. 11, 2018 in the Japanese Patent Application No. 2017-250771 with its English machine translation.

* cited by examiner

BOX-TYPE VEHICLE-MOUNTED CONTROL DEVICE

TECHNICAL FIELD

The present invention relates to a box-type vehicle-mounted control device equipped with a circuit board on which an electronic components are mounted, a base to which the circuit board is fixed, and a cover assembled to the base so as to cover the circuit board, and particularly relates to the box-type vehicle-mounted control device configured to be capable of improving heat dissipation property.

BACKGROUND ART

Conventionally, a box-type vehicle-mounted control device (box-type electronic module) mounted on an automobile typically includes a circuit board on which the electronic components including a heat generating element such as a semiconductor element are mounted, and a casing that contains the circuit board. In this configuration, the casing typically includes a base to which the circuit board is fixed, and a cover assembled to the base to cover the circuit board.

In such a box-type vehicle-mounted control device, a recent trend of miniaturization and multi-functionality due to space restriction has increased the amount of heat generation. Therefore, as disclosed in PTL 1, for example, in order to transfer the heat generated in the electronic components (heat generating elements) to the casing and to dissipate the heat at an outer surface of the casing to the atmosphere, applying surface treatment to the casing has been proposed.

Also in PTL 2, to suppress an occurrence of a crack in the vicinity of a connector attached to the circuit board, applying surface treatment to the circuit board is proposed.

CITATION LIST

Patent Literatures

PTL 1: JP 2004-304200A
PTL 2: JP 2012-204729A

SUMMARY OF INVENTION

Technical Problem

Meanwhile, in recent years, there is a social demand for an engine room that can achieve high-density and miniaturization from a viewpoint of resource saving, or the like. Miniaturization has been promoted also in the box-type vehicle-mounted control device. This also promotes reduction in a substrate area and integration of the electronic components, and thus increases heat generation density, leading to a desire to achieve further improvement in heat dissipation property.

A conventional technique that has been proposed has a structure in which heat is absorbed from the heat generating element by using surface treatment applied to a surface of the casing. With this structure, however, the amount of heat transfer from the circuit board and the heat generating element to the casing is too small to sufficiently perform heat absorption.

In view of the above-described situation, the present invention is intended to provide a box-type vehicle-mounted control device with excellent heat dissipation property and that can effectively increase the amount of heat transfer from the electronic components and the circuit board to the casing (base or cover).

Solution to Problem

To achieve the above object, a box-type vehicle-mounted control device according to the present invention fundamentally includes a circuit board on which electronic components are mounted, a base to which the circuit board is fixed, and a cover assembled to the base so as to cover the circuit board.

On the box-type vehicle-mounted control device, a first heat radiating coating layer is formed on at least one surface of the circuit board, and a second heat radiating coating layer is formed on an inner surface of one or both of the base and the cover facing the first heat radiating coating layer.

The material forming the heat radiating coating layer used in the box-type vehicle-mounted control device according to the present invention is not particularly limited as long as it is a material having heat radiating property. Still, the most desirable material is a composite material made of organic resin and inorganic particles. In this case, conventionally known inorganic particles may be used without any specific limitation. Still, it is desirable to blend at least one of ceramic powders, or the like, of aluminum oxide, magnesium oxide, titanium oxide, zirconia, iron oxide, copper oxide, nickel oxide, cobalt oxide, lithium oxide, zinc oxide, silicon dioxide, or the like, listed as desirable examples.

Advantageous Effects of Invention

According the present invention, at least two heat radiating coating layers are formed. This configuration increases a high-thermal radiation area. In addition, the heat generated from electronic components including heat generating elements as well as the heat that has been transferred to the circuit board can be radiated at one heat radiating coating layer, and the heat can then be absorbed at another heat radiating coating layer formed so as to face the one heat radiating coating layer. This configuration makes it possible to increase the amount of heat transfer from the electronic component and the circuit board to the casing. Accordingly, it is possible to improve heat dissipation property of the box-type vehicle-mounted control device. This improvement can suppress a temperature to a low level inside the casing of the box-type vehicle-mounted control device, including electronic components (heat generating elements) and enhance reliability of the device.

Problems, configurations, and effects other than in the above description will be clarified by the following embodiments.

DESCRIPTION OF EMBODIMENTS

Hereinafter, embodiments of the present invention will be described with reference to the drawings.

FIGS. 1 to 11 are diagrams for describing embodiments (Examples 1 to 9) of the box-type vehicle-mounted control device according to the present invention. In each of the diagrams, portions with same configurations, same functions, or with corresponding relationship with each other are indicated by same or related reference signs. To facilitate understanding of the invention, FIGS. 1 to 11 include exaggerated drawings related to the thicknesses of individual portions, or the like (in particular, the film thicknesses of the heat radiating coating layers).

[Basic Configuration Common to Examples 1 to 9]

Figure 1:
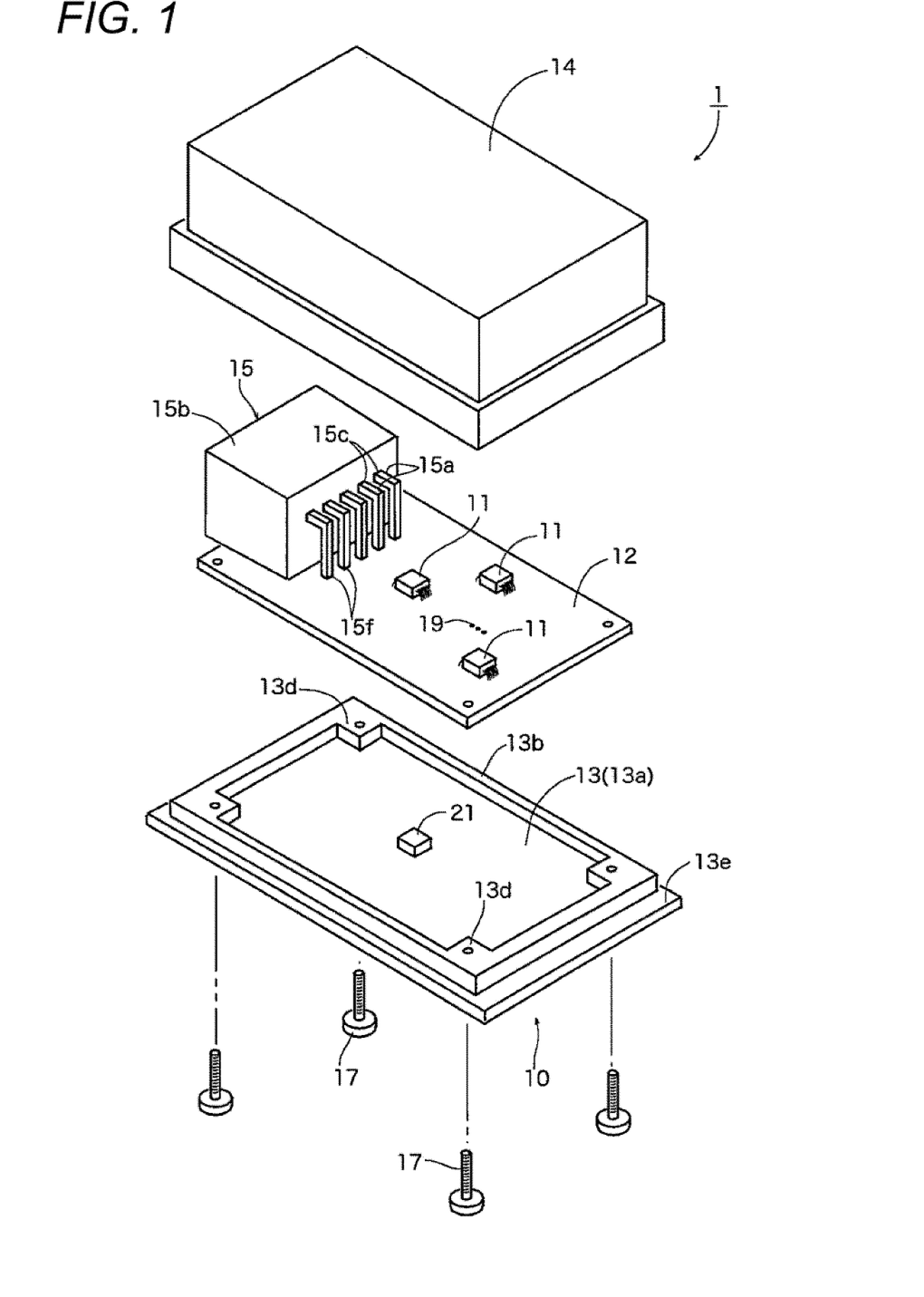
FIG. 1 is an exploded perspective view of a basic configuration of a box-type vehicle-mounted control device according to embodiments (Examples 1 to 9) of the present invention.
Figure 2:
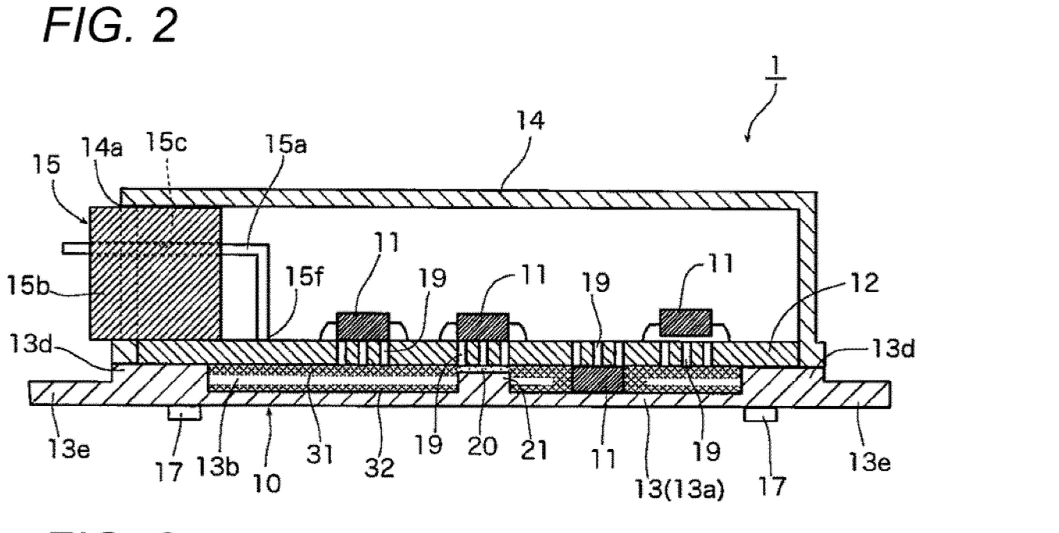
FIG. 2 is a cross-sectional view for describing Example 1.

FIG. 1 is an exploded perspective view of a main configuration of a box-type vehicle-mounted control device according to Example 1 (to Example 9). FIG. 2 is a cross-sectional view for describing Example 1.

The box-type vehicle-mounted control device 1 is configured to include a circuit board 12 and a casing 10 that contains the circuit board 12. On upper/lower (front/back) surfaces of the circuit board 12, electronic components 11, 11, ... including heat generating elements such as an IC and a semiconductor element are mounted by using solder. The casing 10 includes a base 13 to which the circuit board 12 is to be fixed, and a box-shaped or lid-shaped cover 14 that has an open lower surface to be assembled to the base 13 so as to cover the circuit board 12.

On one end of the circuit board 12 in a longitudinal direction, a connector 15 for electrically connecting the circuit board 12 with the outside is attached. The connector 15 includes the required number of pin terminals 15*a*, and a housing 15*b*. The housing 15*b* has through holes 15*c* through which the pin terminals 15*a* are inserted with press-fitting, or the like. On the connector 15, the pin terminal 15*a* is inserted into the through hole 15*c* of the housing 15*b*, and then, a lower end portion (couple-bonding portion 15*f*) of the pin terminal 15*a* is couple-bonded to the circuit board 12 by using solder in a spot flow process, or the like.

The base 13 has an overall substantially rectangular plate-like shape so as to close the open lower surface of the cover 14. Specifically, the base 13 includes a rectangular plate-like portion 13*a*, a rectangular frame-like portion 13*b* protruding on the rectangular plate-like portion 13*a*, a pedestal portion 13*d* that is provided at each of four corners of the rectangular frame-like portion 13*b* and serves as a seat for the circuit board 12, and a vehicle-mounting fixture 13*e* extending on an outer periphery of the rectangular plate-like portion 13*a*. The vehicle-mounting fixture 13*e* is provided to assemble the box-type vehicle-mounted control device 1 to a vehicle body and is fixed to a predetermined position of the vehicle body by engaging with bolts, for example.

The base 13 and the cover 14 included in the casing 10 of the box-type vehicle-mounted control device 1 are assembled in such a way as to sandwich the circuit board 12 on which the connector 15 is attached. More specifically, the circuit board 12, while being held between the pedestal portion 13*d* provided at four corners of the base 13 and the cover 14, is fixed with a set screw 17 as an exemplary fastening member.

A fixing structure for combining the cover 14 and the base 13 is not limited to the above-described structure that is to be screwed and fixed by using the set screw 17. For example, the fixing structure may be such that an assembly hole provided at a standing portion that stands from the base 13 and a protruding portion provided at the cover 14 are fittingly fixed or bonded with each other.

The base 13 and the cover 14 are produced by casting, pressing, cutting, or the like, using a metal material or a resin material. More particularly, the base 13 and the cover 14 are produced by casting, pressing, cutting, or the like, using an alloy composed mainly of aluminum, magnesium, iron, or the like, or using the resin material such as polybutylene terephthalate.

The cover 14 has a window 14*a* for the connector 15 to permit the circuit board 12 to receive power supplied from the outside or to exchange input/output signals with an external device through the connector 15.

On the circuit board 12, four electronic components 11, 11, ... (three on an upper surface, one on a lower surface) are mounted, for example. Circuit wiring provided on the circuit board 12 is connected to each of the electronic components 11, 11, ... as well as connected to the pin terminal 15*a* of the connector 15. On the circuit board 12, a thermal via (through hole) 19 is provided at a portion on which the electronic components 11, 11, ... are mounted.

On a lower surface of the electronic component 11 located at the middle of the three electronic components 11, 11, and 11 mounted on an upper surface of the circuit board 12, the thermal via 19 is provided. In addition, at a position located just below the thermal via 19 on the base 13, a rectangular protrusion 21 is provided. Between a lower surface of the circuit board 12 and an upper surface of the rectangular protrusion 21 on the base 13, a high-thermal conductivity layer 20 is provided so as to contact the lower surface of the circuit board 12 and the upper surface of the rectangular protrusion 21. Herein, examples of the high-thermal conductivity layer 20 include adhesive, grease, and a heat dissipation sheet.

Furthermore, the electronic component 11 (main-body portion thereof) positioned at a right end among the three electronic components 11, 11, and 11 mounted on the upper surface of the circuit board 12 is mounted in a state of being spaced from the upper surface of the circuit board 12. In other words, there is a gap between this electronic component 11 and the circuit board 12.

In the box-type vehicle-mounted control device 1 with the above-described configuration, the heat generated in the electronic components 11, 11, ... is transferred to the base 13 through the thermal via 19 and the high-thermal conductivity layer 20, and dissipated to the atmosphere from the casing 10.

[Heat Radiating Coating Layer Formed in Each of Examples 1 to 9]

In each of Examples (1 to 9), heat radiating coating layers (31, 32, 33, and 34) are formed on specific portions. In this case, after the electronic component 11 and the connector 15 have been mounted on the circuit board 12, the heat radiating coating layer 31 is formed (applied) on one and/or another surface of the circuit board 12. Furthermore, after the base 13 and the cover 14 have been produced to have a predetermined size and form, the heat radiating coating layers 32 and 33 are formed (applied) on an inner surface and/or outer surface of the base 13 and the cover 14. Furthermore, on the pin terminal 15a of the connector 15, the heat radiating coating layer 34 is formed (applied) on a portion between the couple-bonding portion 15f on the circuit board 12-side, and a connector housing 15b.

Examples of desirable coating methods include brush coating, spray coating, and dip coating. However, depending on the object to be coated, electrostatic coating, curtain coating, electrostatic coating, or the like may also be employed.

As a desirable method for forming a coating film after performing coating with the material may be natural drying, baking, or the like.

The material forming the heat radiating coating layers (31, 32, 33, and 34) is not particularly limited as long as it is a material having heat radiating property. Still, the most desirable material may be the composite material made of organic resin and inorganic particles. In this case, conventionally known inorganic particles may be used without any specific limitation. Still, it is desirable to blend at least one of ceramic powders, or the like, of aluminum oxide, magnesium oxide, titanium oxide, zirconia, iron oxide, copper oxide, nickel oxide, cobalt oxide, lithium oxide, zinc oxide, silicon dioxide, or the like, listed as desirable examples.

When blending the ceramic powder, its mean particle size is not particularly limited; still, the desirable size is 0.01 to 200 μm. If the mean particle size of the ceramic powder is too large, (larger than 200 μm), a recommended film thickness for allowing efficient heat radiation might be penetrated, possibly leading to a decrease in a bonding strength and an adhesive force. Conversely, if the mean particle size of the ceramic powder is too small (smaller than 0.01 μm), the ceramic powder might be covered with the organic resin that is a binder, possibly leading to a decrease in heat radiating performance.

In addition, a desirable film thickness of each of the heat radiating coating layers is approximately 1 to 200 μm. If the film thickness is too large, absorbed heat is easily insulated. If the film thickness is too small, the heat radiating performance tends to decrease. That is, if the film thickness is too large or too small, the amount of heat transfer from the electronic components or the circuit board to the casing (base and cover) is decreased. More desirable film thickness of each of the heat radiating coating layer is 20 to 40 μm. If the film thickness is larger than 40 μm, absorbed heat is insulated. If the film thickness if smaller than 20 μm, heat radiating performance is decreased, and the amount of heat transfer from the electronic components 11, 11, . . . and from the circuit board 12 to the casing 10 (the base 13 and the cover 14) is decreased.

As the organic resin, it is possible to use conventionally known one and is not particularly limited. Examples of organic resin include synthetic resin and aqueous emulsion resin. As the synthetic resin, it is possible to use phenol resin, alkyd resin, melamine urea resin, epoxy resin, polyurethane resin, silicone resin, vinyl acetate resin, acrylic resin, chlorinated rubber resin, vinyl chloride resin, fluororesin, or the like. Among these, the most desirable synthetic resin is acrylic resin, which is inexpensive. As the aqueous emulsion, it is possible to use silicone acrylic emulsion, urethane emulsion, acrylic emulsion, or the like.

Next, Examples 1 to 9 will be described in sequence.

Example 1

In Example 1, as illustrated in FIG. 2, a first heat radiating coating layer 31 having emissivity of 0.80 or higher is formed on a lower surface (base 13-side) of the circuit board 12 on which the electronic component 11 is mounted, at a portion other than the electronic component 11 and the high-thermal conductivity layer 20. In addition, a second heat radiating coating layer 32 having emissivity of 0.80 or higher is formed on an inner surface (specifically, a surface facing the first heat radiating coating layer 31) of the base 13. The heat radiating coating layer 31 (32) is formed also on an outer periphery of the electronic component 11 mounted on a lower surface of the circuit board 12.

In Example 1, a material containing 45% titanium oxide based on the acrylic resin is employed as the heat radiating coating layers 31 and 32. The material has been applied with brush coating to the circuit board 12, heated and dried at 80° C. and for 30 minutes so as to achieve a film thickness of 30 μm.

Forming the first heat radiating coating layer 31 and the second heat radiating coating layer 32 in this manner increases a high-thermal radiation area. In addition, the heat generated from the electronic components 11, 11, . . . including the heat generating element, as well as the heat transferred to the circuit board 12, is transferred to the first heat radiating coating layer 31 through the circuit board 12 and the thermal via 19. The transferred heat is then radiated from the first heat radiating coating layer 31, and absorbed at the second heat radiating coating layer 32 facing the first heat radiating coating layer 31. This configuration makes it possible to increase the amount of heat transfer from the electronic components 11, 11, . . . and from the circuit board 12 to the base 13 (casing 10).

Accordingly, it is possible to improve heat dissipation property of the box-type vehicle-mounted control device 1. This improvement can suppress the temperature to a low level inside the casing 10 of the box-type vehicle-mounted control device 1, including an electronic components 11, 11, . . . leading to enhanced reliability of the device.

Moreover, by forming the first heat radiating coating layer 31 on the circuit board 12 surface on which no electronic component 11 is mounted, the heat coming from the electronic component 11 is transferred to the first heat radiating coating layer 31 through the thermal via 19. Then, the coating layer 31 radiates the heat. With this configuration, it is possible to promote heat dissipation from the electronic component 11 to the base 13.

The desirable film thickness of the first heat radiating coating layer 31 and the second heat radiating coating layer 32 is approximately 1 to 200 μm, and more desirably, 20 to 40 μm.

The first heat radiating coating layer 31 and the second heat radiating coating layer 32 may have different compositions. Desirably, the composition is such that each of the coating layers contains a same filler or that the layers are overlapping with each other at 0.5 or higher absorbance in an infrared absorption region at 1200 to 500 cm$^{-1}$ (wavelength represented in centimeter and then inversed). With such a composition, the heat radiated from the first heat radiating coating layer 31 can be efficiently absorbed by the second heat radiating coating layer 32.

In a case where the electronic component 11 has been mounted (the electronic component 11 at a right end in FIG. 2) while there is a gap between the electronic component 11 and the circuit board 12, it is desirable that the heat radiating coating layer 31 be formed in this gap or a back side of the electronic component 11 (the heat radiating coating layer 31 is formed in this gap in Examples 3 and 4 to be described below). With this configuration, the heat generated by the electronic component 11 can be absorbed by the first heat radiating coating layer 31, making it possible to increase the amount of heat transfer to the circuit board 12.

It is desirable that the first heat radiating coating layer 31 and the second heat radiating coating layer 32 be directly applied to each of base materials. On the circuit board 12, for example, if the heat radiating coating layer is formed after applying surface treatment such as moisture-proof coating, the film thickness between the surface of the circuit board 12 and the surface of heat radiating coating layer is increased. This decreases the amount of heat transfer, lowering heat dissipation property.

The portion for forming the first heat radiating coating layer 31 and the second heat radiating coating layer 32 is not limited to an entire surface of each of the surfaces. The heat radiating coating layers 31 and 32 may be formed at one portion, specifically at heat-generating components and their surroundings. This can decrease the amount of use of a coating material for forming the coating layers 31 and 32.

Moreover, providing a heat dissipation fin on an outer surface of the base 13 on an inner surface of which the second heat radiating coating layer 32 is provided, makes it easier to dissipate to the atmosphere the heat absorbed by the casing 10 from the circuit board 12 and the electronic component 11.

In addition, roughening surface conditions (forming minute irregularities, or the like) on the first heat radiating coating layer 31 and the second heat radiating coating layer 32 increases the surface areas of the coating layers 31 and 32. This increases the amount of heat transfer of the first heat radiating coating layer 31 and the second heat radiating coating layer 32 and improves heat dissipation property.

Example 2

Figure 3:
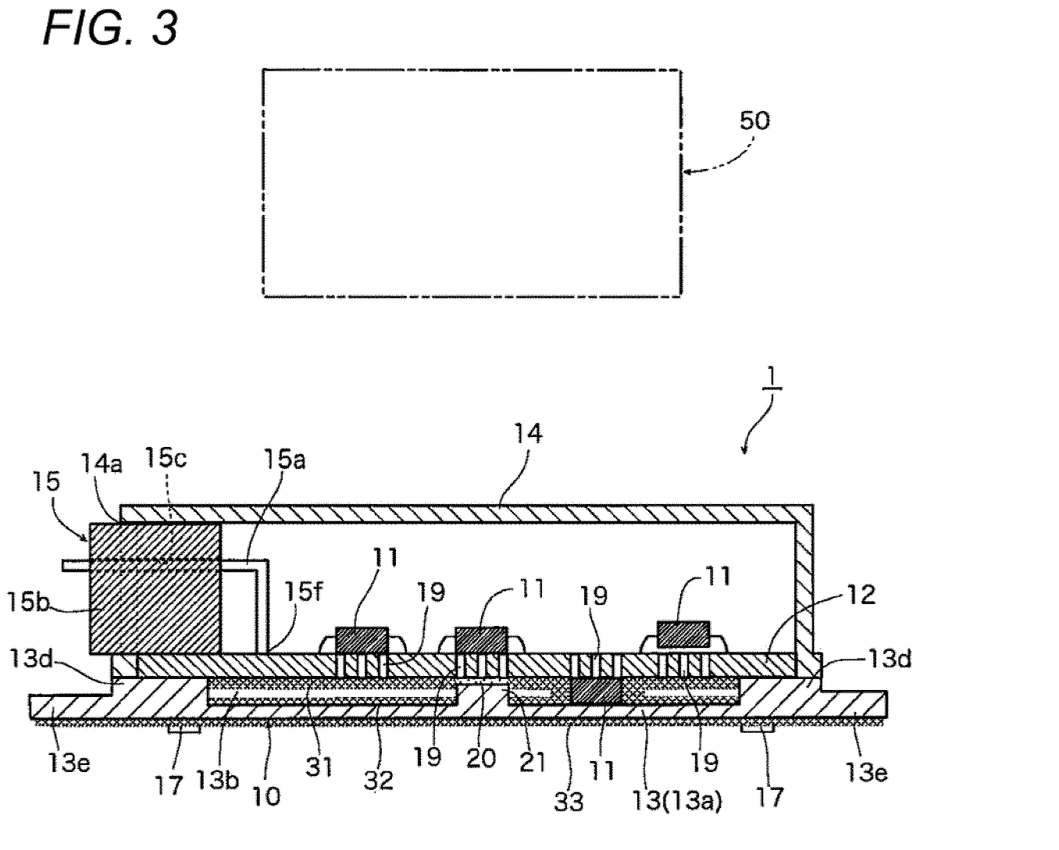
FIG. 3 is a cross-sectional view for describing Example 2.

In Example 2, as illustrated in FIG. 3, the first heat radiating coating layer 31 having emissivity of 0.80 or higher is formed on a surface of a surface (base 13-side) that is not facing a heat source 50 (vehicle-mounted engine, for example) on the circuit board 12. In addition, the second heat radiating coating layer 32 having emissivity of 0.80 or higher is formed on an inner surface (specifically, an upper surface facing the first heat radiating coating layer 31) of the base 13. Furthermore, a third heat radiating coating layer 33 having emissivity of 0.80 or higher is formed on an outer surface (lower surface) of the base 13 on the inner surface of which the second heat radiating coating layer 32 is formed.

In Example 2 with this configuration, no heat radiating coating layer is formed on a heat source 50-side (upper surface of the circuit board 12 and inner/outer surface of the cover 14). This makes it possible to suppress absorption of the heat emitted from the heat source 50 and to radiate the heat transferred to the base 13 through the first heat radiating coating layer 31 and the second heat radiating coating layer 32 to the atmosphere at the third heat radiating coating layer 33.

This configuration, compared with Example 1, can increase the amount of heat transfer from the circuit board 12 and the electronic component 11 to the atmosphere. As a result, heat dissipation property of the box-type vehicle-mounted control device 1 can be improved. As a result, this configuration can further suppress the temperature to a lower level inside the casing 10 of the box-type vehicle-mounted control device 1 including the electronic components 11, 11, . . . and enhance reliability of the device.

Compositions of the first heat radiating coating layer 31, the second heat radiating coating layer 32, and the third heat radiating coating layer 33 may differ from each other. Still, it is desirable that the composition be such that each of the coating layers contains a same filler or that the layers are overlapping with each other at 0.5 or higher absorbance in an infrared absorption region at 1200 to 500 cm$^{-1}$. This configuration makes it possible for the second heat radiating coating layer 32 to efficiently absorb the heat radiated from the first heat radiating coating layer 31, and for the third heat radiating coating layer 33 to dissipate the heat. Accordingly, heat dissipation property is improved.

Specification including the film thickness of the third heat radiating coating layer 33 is similar to specification of the first heat radiating coating layer 31 and of the second heat radiating coating layer 32. The desirable film thickness is approximately 1 to 200 µm, and more desirably, 20 to 40 µm. If the film thickness is too large, the absorbed heat is insulated. If the film thickness is too small, heat radiating performance is lowered and the amount of heat transfer from the base 13 to the atmosphere is decreased. Roughening the surface condition of the third heat radiating coating layer 33 (forming minute irregularities, or the like) increases the surface area of the coating layer 33 and further improves heat dissipation property.

Example 3

Figure 4:
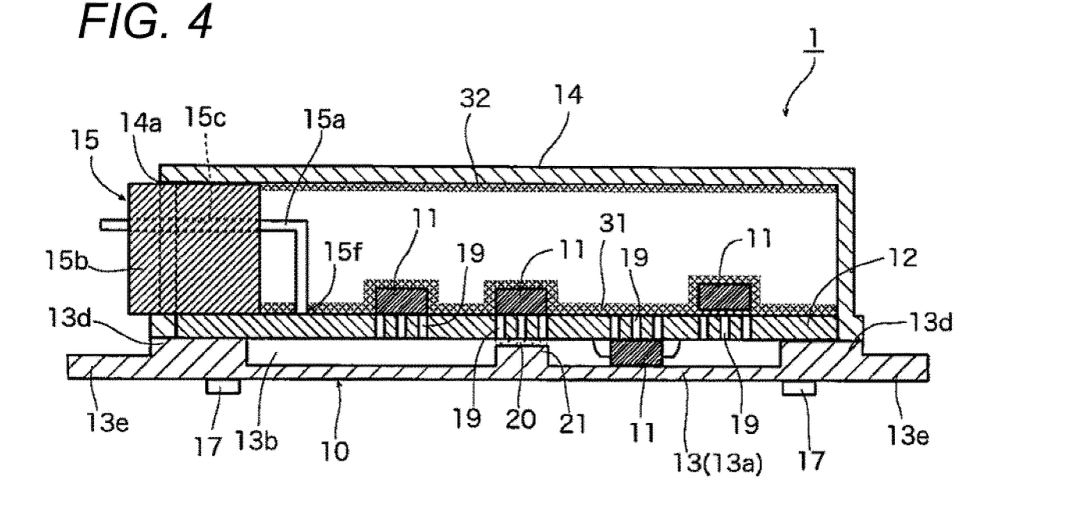
FIG. 4 is a cross-sectional view for describing Example 3.

In Example 3, as illustrated in FIG. 4, the first heat radiating coating layer 31 having emissivity of 0.80 or higher is formed on a surface (upper surface) of the cover 14 of the circuit board 12 on which the electronic component 11 is mounted. In addition, the second heat radiating coating layer 32 having emissivity of 0.80 or higher is formed on an inner surface (specifically, a lower surface facing the first heat radiating coating layer 31) of the cover 14. Herein, the first heat radiating coating layer 31 is formed so as to cover the electronic components 11, 11, and 11 mounted on an upper surface of the circuit board 12. Between the electronic component 11 located at a right end and the circuit board 12, a gap is formed. It is configured such that the first heat radiating coating layer 31 fills this gap.

Forming the first heat radiating coating layer 31 and the second heat radiating coating layer 32 in this manner increases a high-thermal radiation area. In addition, the heat generated from the electronic components 11, 11, . . . including the heat generating element as well as the heat transferred to the circuit board 12 is then transferred to the first heat radiating coating layer 31 and radiated from the first heat radiating coating layer 31, and then, is absorbed at the second heat radiating coating layer 32 that is a facing surface. Accordingly, it is possible to increase the amount of heat transfer from the electronic components 11, 11, . . . and from the circuit board 12 to the cover 14 (casing 10). As a result, heat dissipation property of the box-type vehicle-mounted control device 1 can be improved. This configuration can suppress the temperature to a low level inside the casing 10 of the box-type vehicle-mounted control device 1, including the electronic components 11, 11, . . . and enhance reliability of the device.

Moreover, by forming the first heat radiating coating layer 31 on the circuit board 12 surface on which no electronic component 11 is mounted, the heat coming from the electronic component 11 is transferred to the first heat radiating coating layer 31 through the thermal via 19. Then, the coating layer 31 radiates the heat. With this configuration, it is possible to promote heat dissipation from the electronic component 11 to the cover 14.

Moreover, providing a heat dissipation fin on an outer surface of the cover 14 on an inner surface of which the second heat radiating coating layer 32 is provided, makes it easier to dissipate to the atmosphere the heat absorbed by the casing from the circuit board 12 and the electronic component 11.

In addition, roughening surface conditions (forming minute irregularities, or the like) on the first heat radiating coating layer 31 and the second heat radiating coating layer 32 increases the surface areas of the coating layers 31 and 32. This increases the amount of heat transfer of the first heat radiating coating layer 31 and the second heat radiating coating layer 32 and improves heat dissipation property.

Specifications, or the like, of the first heat radiating coating layer 31 and the second heat radiating coating layer 32 are the same as the specifications, or the like, of the above-described Examples 1 and 2, and thus will be omitted.

Example 4

Figure 5:
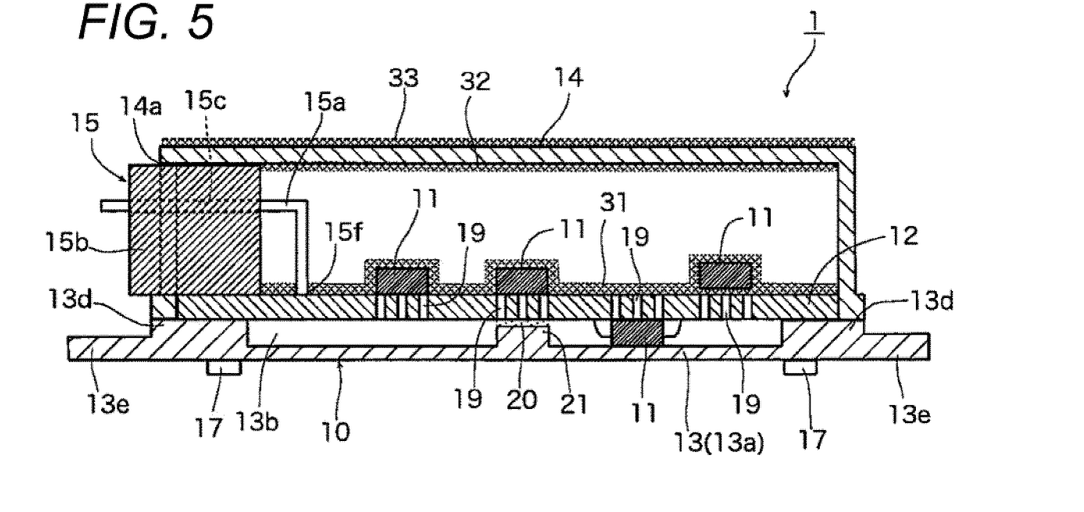
FIG. 5 is a cross-sectional view for describing Example 4.

In Example 4, as illustrated in FIG. 5, the first heat radiating coating layer 31 having emissivity of 0.80 or higher is formed on a surface on (cover 14-side) that is not facing the heat source 50 (vehicle-mounted engine, for example) on the circuit board 12. In addition, the second heat radiating coating layer 32 having emissivity of 0.80 or higher is formed on an inner surface (specifically, a lower surface facing the first heat radiating coating layer 31) of the cover 14. Furthermore, the third heat radiating coating layer 33 having emissivity of 0.80 or higher is formed on an outer surface (upper surface) of the cover 14 on an inner surface of which the second heat radiating coating layer 32 is formed.

In Example 4 with this configuration, the heat radiating coating layer is not formed on the heat source 50-side (lower surface of the circuit board 12 and inner/outer surface of the base 13). This makes it possible to suppress absorption of the heat emitted from the heat source 50 and to radiate the heat transferred to the cover 14 through the first heat radiating coating layer 31 and the second heat radiating coating layer 32 to the atmosphere at the third heat radiating coating layer 33.

This configuration, compared with Example 3, enables further increasing the amount of heat transfer from the circuit board 12 and the electronic component 11 to the atmosphere. As a result, heat dissipation property of the box-type vehicle-mounted control device 1 can be further improved. This configuration can further suppress the temperature to a lower level inside the casing 10 of the box-type vehicle-mounted control device 1 including the electronic components 11, 11, . . . and enhance reliability of the device.

Specifications, or the like, of the first heat radiating coating layer 31 and the second heat radiating coating layer 32 and the third heat radiating coating layer 33 are the same as the specifications, or the like of the above-described Examples 1, 2, and 3, and thus will be omitted.

Example 5

Figure 6:
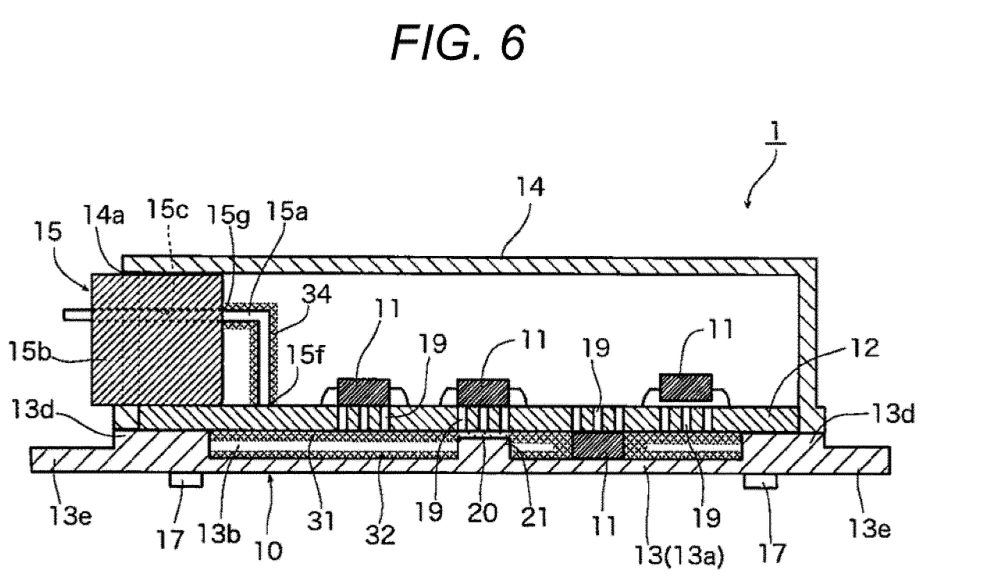
FIG. 6 is a cross-sectional view for describing Example 5.
Figure 7:
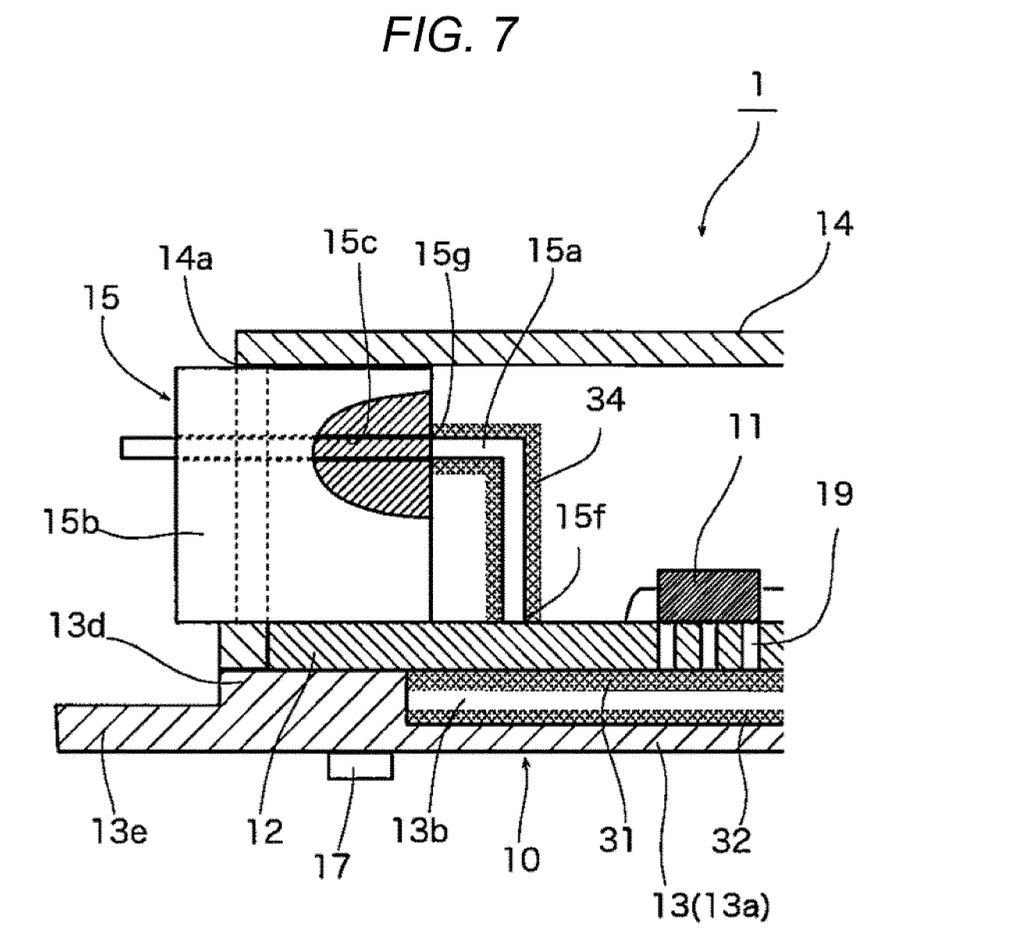
FIG. 7 is a cutaway enlarged sectional view of a portion around a connector illustrated in FIG. 6.
Figure 8:
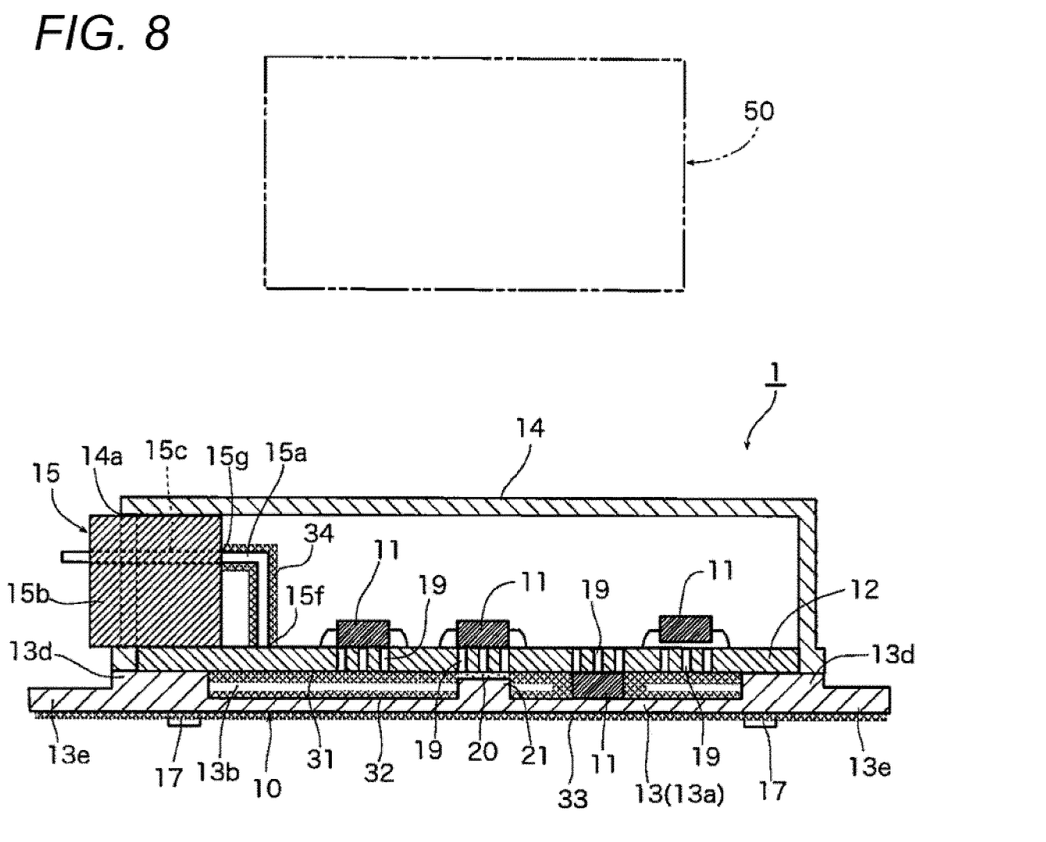
FIG. 8 is a cross-sectional view for describing Example 6.
Figure 9:
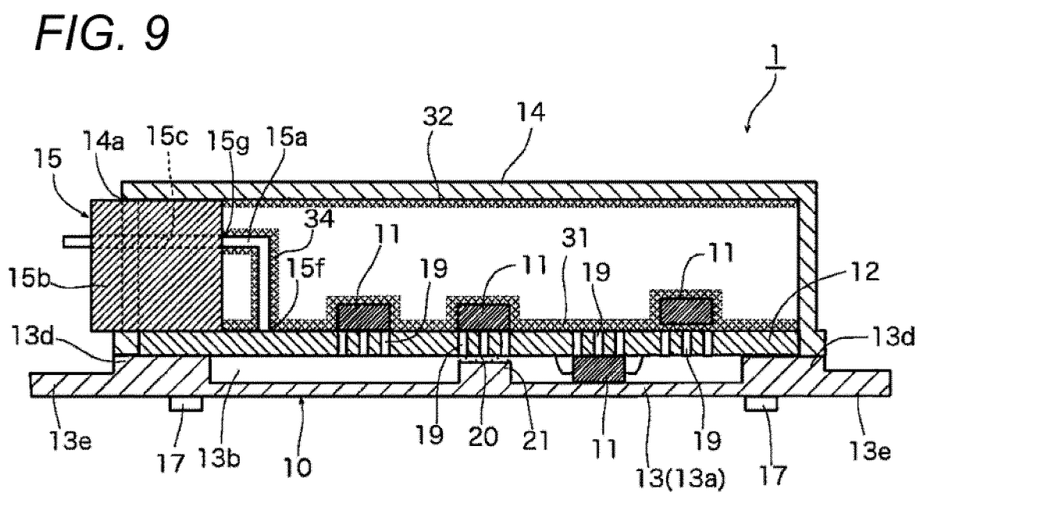
FIG. 9 is a cross-sectional view for describing Example 7.
Figure 10:
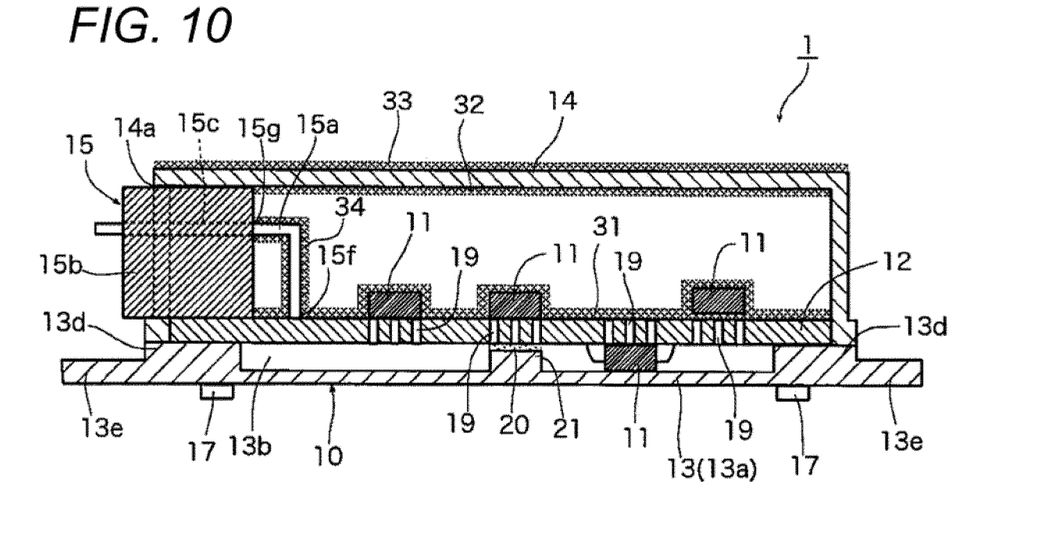
FIG. 10 is a cross-sectional view for describing Example 8.
Figure 11:
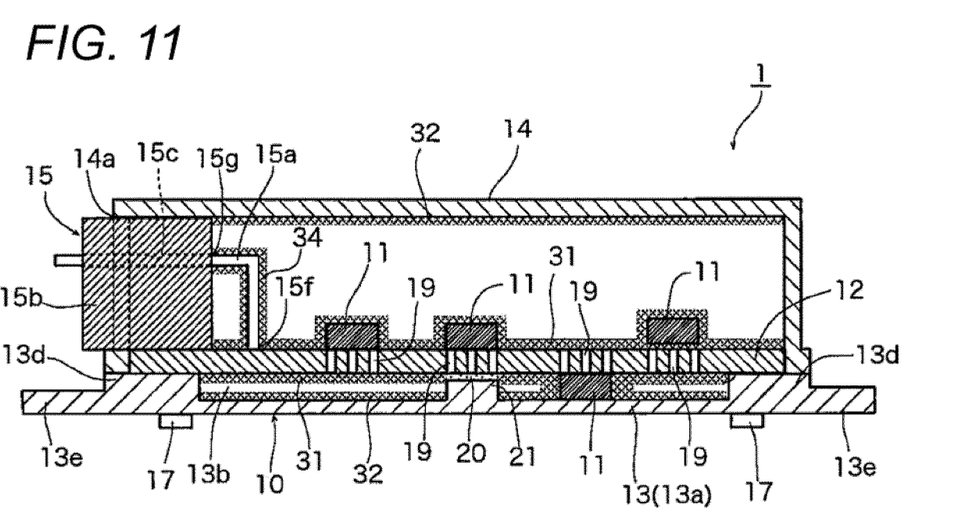
FIG. 11 is a cross-sectional view for describing Example 9.

Example 5 will be described focusing on a difference from the Examples 1 to 4. In Example 5, as illustrated in FIGS. 6 and 7, similarly to Example 1, the first heat radiating coating layer 31 and the second heat radiating coating layer 32 are formed. In addition, a fourth heat radiating coating layer 34 having emissivity of 0.80 or higher is formed on the pin terminal 15a of the connector 15 so as to cover an entire periphery of a portion ranging from the circuit board 12-side couple-bonding portion 15f to the connector housing 15b.

With this configuration, the heat transferred from the electronic components 11, 11, . . . as well as from the circuit board 12 to the pin terminal 15a is absorbed at the fourth heat radiating coating layer 34. This heat is then transferred from the pin terminal 15a to an external connector (not illustrated) and then dissipated to the outside of the casing 10. This configuration, compared with Example 1, enables further increasing the amount of heat transfer from the circuit board 12 and the electronic component 11 to the outside (to the atmosphere). As a result, heat dissipation property of the box-type vehicle-mounted control device 1 can be further improved. This configuration can further suppress the temperature to a lower level inside the casing 10 of the box-type vehicle-mounted control device 1 including the electronic components 11, 11, . . . and enhance reliability of the device.

The fourth heat radiating coating layer 34 need not be applied to entire portions (entire periphery, entire length) of the pin terminal 15a. Accordingly, it is possible to decrease the amount of use of the coating material.

In one desirable aspect, as illustrated in FIG. 7, the fourth heat radiating coating layer 34 is formed so as to fill a portion between the pin terminal 15a and the through hole 15c of the housing 15b to which the pin terminal 15a is attached. In other words, the fourth heat radiating coating layer 34 is formed so as to seal a minute gap portion 15g formed between an inner end portion of each of the through holes 15c and each of the pin terminals 15a (coating is applied so as to cover the gap portion 15g by forming the film thickness of the fourth heat radiating coating layer 34 to be thicker than the gap portion 15g, or by any other method). By sealing the portion between the pin terminal 15a and the through hole 15c in this manner, it is possible to prevent water from entering inside the box-type vehicle-mounted control device 1 (casing 10) from the outside.

Specification of the fourth heat radiating coating layer 34 is similar to the specifications of the first, the second, and the third heat radiating coating layers 31, 32, and 33. The desirable film thickness is approximately 1 to 200 µm, more desirably, 20 to 40 µm.

Compositions of the first heat radiating coating layer 31, the second heat radiating coating layer 32, and the fourth heat radiating coating layer 34 may differ from each other. Still, it is desirable that the compositions be such that each of the coating layers contains a same filler or that the layers are overlapping with each other at 0.5 or higher absorbance in an infrared absorption region at 1200 to 500 cm$^{-1}$. With this composition, the heat radiated from the first heat radiating coating layer 31 can be efficiently absorbed by the second heat radiating coating layer 32 and the fourth heat radiating coating layer 34. Accordingly, heat dissipation property is improved. Furthermore, roughening the surface condition of the fourth heat radiating coating layer 34 (forming minute irregularities, or the like) increases the surface area of the coating layer 34 and improves heat absorbing property.

Examples 6, 7, 8, and 9

Each of Examples 6, 7, 8, and 9, as illustrated in FIGS. 8, 9, 10, and 11, respectively, has a configuration of each of Examples 2, 3, 4, and a combination of Examples 1 and 3, as a base. In addition, each of Examples 6, 7, 8, and 9 has a configuration in which the fourth heat radiating coating layer 34 having emissivity of 0.80 or higher is formed on the pin terminal 15*a* of the connector 15 so as to cover a portion ranging from the couple-bonding portion 15*f* joined with the circuit board 12, to the connector housing 15*b*.

This leads to another functional effect of forming the fourth heat radiating coating layer 34 in addition to the functional effects of each of Examples 2, 3, 4, and the combination of Examples 1 and 3. This configuration enables further increasing the amount of heat transfer from the circuit board 12 and the electronic component 11 to the outside (to the atmosphere). As a result, heat dissipation property of the box-type vehicle-mounted control device 1 can be further improved. This configuration can further suppress the temperature to a lower level inside the casing 10 of the box-type vehicle-mounted control device 1 including the electronic components 11, 11, . . . and enhance reliability of the device. Specifications, or the like, of each of the heat radiating coating layers 31, 32, 33, and 34 are the same as the specification, or the like, of the above-described Examples 1 to 5, and thus will be omitted.

To confirm functional effects of each of examples of the box-type vehicle-mounted control device 1 according to the present invention, a comparative test has been performed by using the following Comparative Example 1 and Comparative Example 2.

Comparative Example 1

Figure 12:
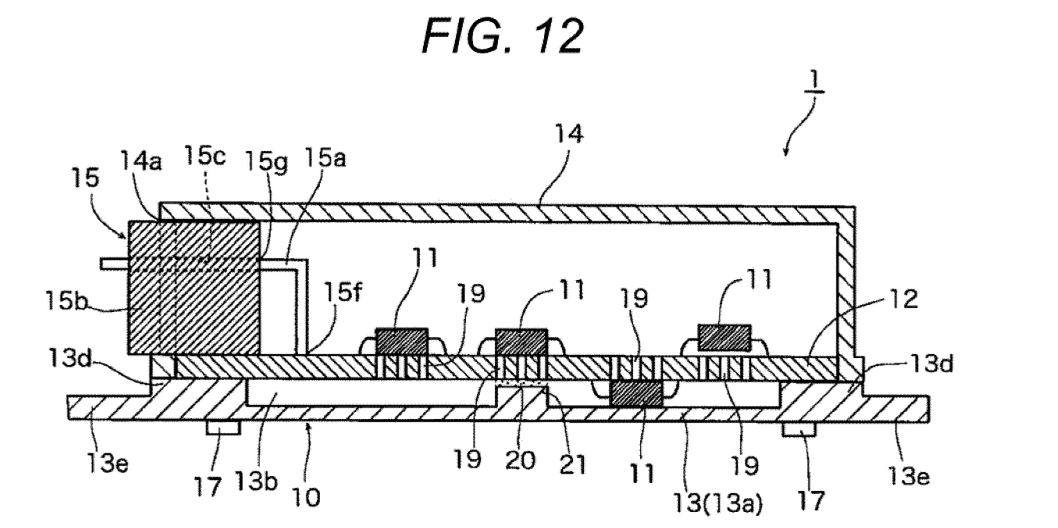
FIG. 12 is a cross-sectional view for describing Comparative Example 1.

Comparative Example 1 is, as illustrated in FIG. 12, has a configuration in which none of the heat radiating coating layers (31, 32, 33, and 34) is formed in the box-type vehicle-mounted control device 1. Accordingly, the amount of heat transfer of the heat generated at the electronic component 11 including a heat generating element and the amount of the heat transferred to the circuit board 12 are small, resulting in insufficient heat dissipation property.

Comparative Example 2

Figure 13:
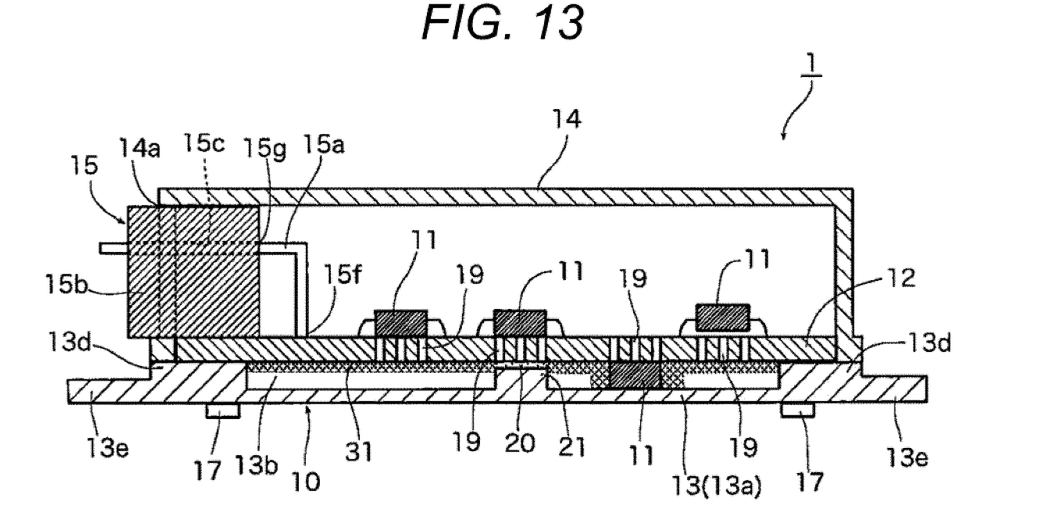
FIG. 13 is a cross-sectional view for describing Comparative Example 2.

Comparative Example 2 is, as illustrated in FIG. 13, has a configuration in which the first heat radiating coating layer 31 is formed only on one surface (lower surface) of the circuit board 12 of the box-type vehicle-mounted control device 1. Accordingly, although the heat generated at the electronic component 11 including the heat generating element as well as the heat transferred to the circuit board 12 is radiated, no heat absorption on a facing surface can be expected.

Table 1 illustrates configurations and heat dissipation effects of the box-type vehicle-mounted control device 1 for Examples 1, 2, 5, and 6, and for Comparative Examples 1 and 2. According to Table 1, it is understandable that, when the heat radiating coating layers 31, 32, 33, and 34 are formed at specific portions of the circuit board 12, the base 13, the cover 14, and the pin terminal 15*a* of the connector 15, the amount of heat transfer of the heat generated at the electronic component 11 including the heat generating element as well as of the heat transferred to the circuit board 12 is increased, leading to improvement of heat dissipation property.

TABLE 1

|  |  | Comparative Example 1 | Comparative Example 2 | Example 1 | Example 2 | Example 5 | Example 6 |
|---|---|---|---|---|---|---|---|
| Configuration | Circuit board | X | ◯ | ◯ | ◯ | ◯ | ◯ |
|  | Inner surface of casing | X | X | ◯ | ◯ | ◯ | ◯ |
|  | Outer surface of casing | X | X | X | ◯ | X | ◯ |
|  | Connector | X | X | X | X | ◯ | ◯ |
| Maximum temperature inside casing |  | 100° C. | 95° C. | 90° C. | 80° C. | 75° C. | 70° C. |

X Without heat radiating coating layer
◯ With heat radiating coating layar

REFERENCE SIGNS LIST

1 box-type vehicle-mounted control device
10 casing
11 electronic component
12 circuit board
13 base
14 cover
15 connector
15*a* pin terminal
15*b* housing
15*c* through hole
19 thermal via
20 high-thermal conductivity layer
31 first heat radiating coating layer
32 second heat radiating coating layer
33 third heat radiating coating layer
34 fourth heat radiating coating layer
50 heat source

The invention claimed is:
1. A vehicle-mounted control device comprising:
a circuit board on which an electronic component is mounted;
a casing configured to contain the circuit board, wherein the casing comprises:
a base to which the circuit board is fixed, and
a cover assembled to the base so as to cover the circuit board;
a connection terminal coupled to a first surface of the circuit board, the connection terminal configured to electrically connect the circuit board with an outside of the casing;
a connector housing configured to contain at least a portion of the connection terminal;
a first heat radiating coating layer disposed on a surface layer of the connection terminal between the circuit board and the connector housing, wherein a film thickness of the first heat radiating coating layer is between 1 micrometers (μm) and 200 micrometers (μm), and the first heat radiating coating layer is not in contact with the casing;
a second heat radiating coating layer disposed on the first surface of the circuit board that is opposite a second surface of the circuit board facing the base, wherein the first surface is the only surface of the circuit board on which the second heat radiating coating layer is disposed; and
a third heat radiating coating layer disposed on an inner surface of the cover facing the second heat radiating coating layer,
wherein each of the first, second, and third heat radiating coating layers is made of a composite material including organic resin to which inorganic particles have been blended,
wherein a thermal via is provided in the circuit board at a portion on which the electronic component is mounted,
wherein the base comprises a rectangular protrusion extending towards the circuit board from a flat portion of the base, and
wherein the vehicle-mounted control device further comprises a high-thermal conductivity layer extending from the second surface of the circuit board to the rectangular protrusion and contacting the second surface of the circuit board, the thermal via, and the rectangular protrusion, the high-thermal conductivity layer comprising one of adhesive, grease, or a heat dissipation sheet.

2. The vehicle-mounted control device according to claim 1,
wherein the casing comprises:
a fourth heat radiating coating layer disposed on an outer surface of the cover.

3. The vehicle-mounted control device according to claim 1,
wherein the connection terminal comprises a plurality of pin terminals, and the connector housing defines one or more through holes through which the pin terminals are inserted, and the first heat radiating coating layer is disposed on one or more of the pin terminals so as to cover a part or all of a portion of the one or more pin terminals ranging from a circuit board-side couple-bonding portion to the connector housing.

4. The vehicle-mounted control device according to claim 3,
wherein the first heat radiating coating layer is formed so as to seal a gap portion formed between each of the pin terminals and each of the through holes, respectively.

5. The vehicle-mounted control device according to claim 2,
wherein infrared absorption regions of at least two of the first, second, third, and fourth heat radiating coating layers formed in the device overlap with each other.

6. The vehicle-mounted control device according to claim 1,
wherein the second heat radiating coating layer is further formed at a gap portion formed between the circuit board and the electronic component mounted on the circuit board in a state of being spaced from the circuit board.

7. The vehicle-mounted control device according to claim 1,
wherein a heat dissipation fin is provided on an outer surface of the cover on which the third heat radiating coating layer is formed.

8. The vehicle-mounted control device according to claim 1,
wherein a surface condition of each of the heat radiating coating layers is roughened.

9. The vehicle-mounted control device according to claim 1,
wherein the inorganic particles include at least one ceramic powder of the following ceramic powders: aluminum oxide, magnesium oxide, titanium oxide, zirconia, iron oxide, copper oxide, nickel oxide, cobalt oxide, lithium oxide, zinc oxide, or silicon dioxide.

10. The vehicle-mounted control device according to claim 9,
wherein the at least one ceramic powder has a mean particle size between 0.01 micrometers (μm) and 200 micrometers (μm).

11. The vehicle-mounted control device according to claim 1,
wherein the organic resin being used is a synthetic resin or an aqueous emulsion resin.

12. The vehicle-mounted control device according to claim 11,
wherein the synthetic resin is any of the group consisting of phenol resin, alkyd resin, melamine urea resin, epoxy resin, polyurethane resin, silicone resin, vinyl acetate resin, acrylic resin, chlorinated rubber resin, vinyl chloride resin, and fluororesin.

13. The vehicle-mounted control device according to claim 11,
wherein the aqueous emulsion resin is any of the group consisting of silicone acrylic emulsion, urethane emulsion, and acrylic emulsion.

14. The vehicle-mounted control device according to claim 1,
wherein a film thickness of each of the heat radiating coating layers is between 1 micrometer (μm) and 200 micrometers (μm).

15. The vehicle-mounted control device according to claim 1,
wherein a film thickness of each of the heat radiating coating layers is between 20 micrometers (μm) and 40 micrometers (μm).

16. The vehicle-mounted control device according to claim 1,
wherein the base is between the second heat radiating coating layer and a heat source, without the first heat radiating coating layer between the second heat radiating coating layer and the heat source.

* * * * *